United States Patent [19]

Mariani et al.

[11] Patent Number: 4,999,535
[45] Date of Patent: Mar. 12, 1991

[54] SAW TRANSDUCER WITH IMPROVED BUS-BAR DESIGN

[75] Inventors: Elio A. Mariani, Hamilton Square, N.J.; Clinton S. Hartmann, Dallas, Tex.

[73] Assignee: The United States of America as represented by the Secretary of the Army, Washington, D.C.

[21] Appl. No.: 412,054

[22] Filed: Sep. 25, 1989

[51] Int. Cl.⁵ ............................................. H01L 41/08
[52] U.S. Cl. ............................. 310/313 B; 310/313 R; 310/312; 310/326; 333/151
[58] Field of Search ............... 310/312, 313 B, 313 C, 310/365, 366; 333/151, 154, 194

[56] References Cited
FOREIGN PATENT DOCUMENTS

| 0072137 | 6/1977 | Japan | 333/151 |
| 0003306 | 1/1983 | Japan | 333/151 |
| 2108800 | 5/1983 | United Kingdom | 333/151 |

Primary Examiner—Mark O. Budd
Attorney, Agent, or Firm—Michael Zelenka; Ann M. Knab

[57] ABSTRACT

A surface acoustic wave (SAW) transducer comprises a piezoelectric substrate, a pair of metal bus bars positioned on the substrate parallel to and separated from each other a preselected distance and a plurality of interdigital electrode fingers extending from each of the metal bus bars. A plurality of slots are positioned along each metal bus bar so that the bus bar metallization is reduced and the acoustic wave velocity is increased in the metal bus bar region.

4 Claims, 4 Drawing Sheets

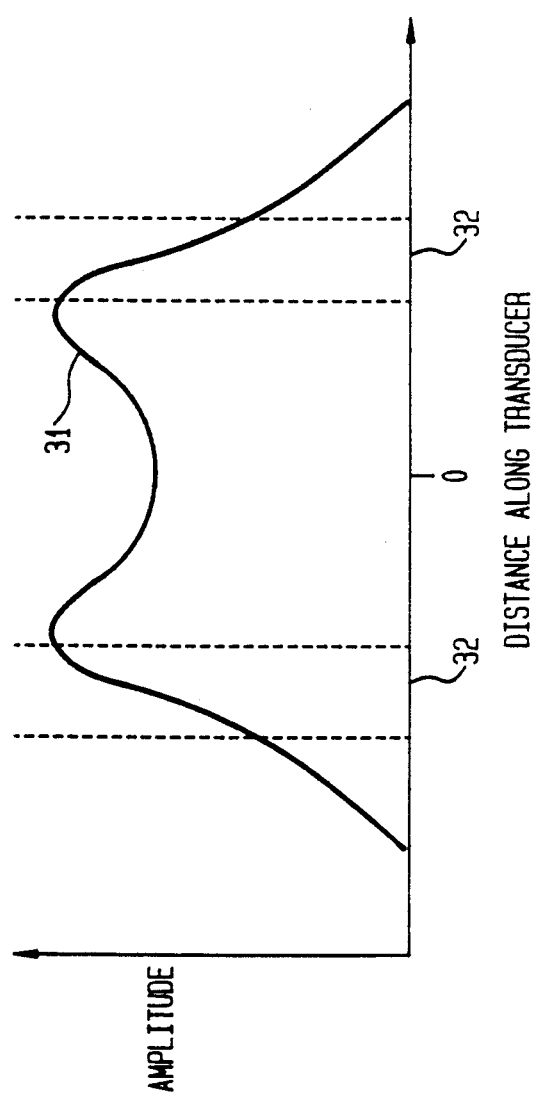

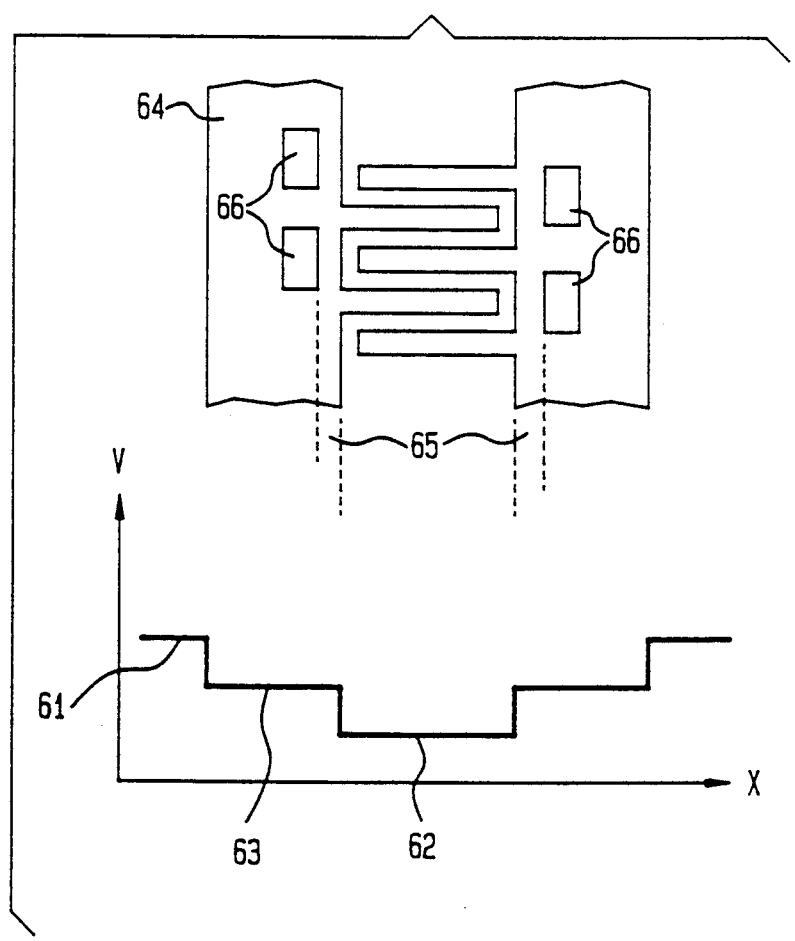

SAW TRANSDUCER WITH IMPROVED BUS-BAR DESIGN

The invention described herein may be manufactured, used, and licensed by or for the Government for governmental purposes without the payment to me or any royalties thereon.

TECHNICAL FIELD

The present invention relates generally to surface acoustic wave (SAW) device technology and acoustic signal processing and more particularly, to a SAW device that substantially eliminates a troublesome, undesired mode that exists in current conventional SAW transducers and achieves better device design accuracy.

BACKGROUND OF THE INVENTION

SAW transducer devices, by way of example, have important uses in communications (e.g. cellular radio, data transmission, etc.) radar, signal processing systems, and so on. SAW transducer devices have proven attractive because they are inexpensive, of compact size, and are amenable to specific design criteria; e.g., phase and amplitude can be controlled or designed independently.

Conventional SAW transducers consist of three wave velocity regions: free-surface (crystal surface) semi-metal surface (interdigital electrodes) and metal surface (bus bars). The electrodes and bus bars, in effect, form an acoustic waveguide since both the metal bus bars and electrodes provide a "slow wave" structure.

Unfortunately, large portions of the acoustic energy are directed along the bus bars of the transducers. This leakage of energy to the bus bars leads to distortion and reflection of waves and increases the device insertion loss.

Accordingly, in order to minimize distortion, reflection, and insertion loss, the acoustic energy should be confined to the interdigital electrode region.

SUMMARY OF THE INVENTION

It is the primary object of the present invention to improve the performance of SAW devices by minimizing leakage of the acoustic energy in the bus bar region of the transducer.

A related object of the invention is to lower the insertion loss of SAW devices.

Still another object of the invention is to improve the effectiveness of the acoustic aperture.

The above and other objects are achieved in accordance with the invention wherein a pair of metal bus bars are positioned parallel to and separated from each other a preselected distance on a piezoelectric substrate. The metal bus bars comprise a plurality of slots along each respective length and a plurality of interdigital electrode fingers extend from each metal bus bar. The slots on the bus bars may be arranged in various arrays such as squares or rectangles. By introducing slots to the bus bars, bus bar metallization is reduced and the acoustic wave velocity is increased in the bus bar region.

BRIEF DESCRIPTION OF THE DRAWINGS

The invention will be more fully appreciated from the following detailed description when the same is considered in connection with the accompanying drawings, in which:

FIG. 3 is a guided hyperbolic mode profile for a conventional transducer waveguide.

FIG. 6 shows the velocity profile of a SAW transducer in accordance with the present invention.

DETAILED DESCRIPTION

Figure 1:
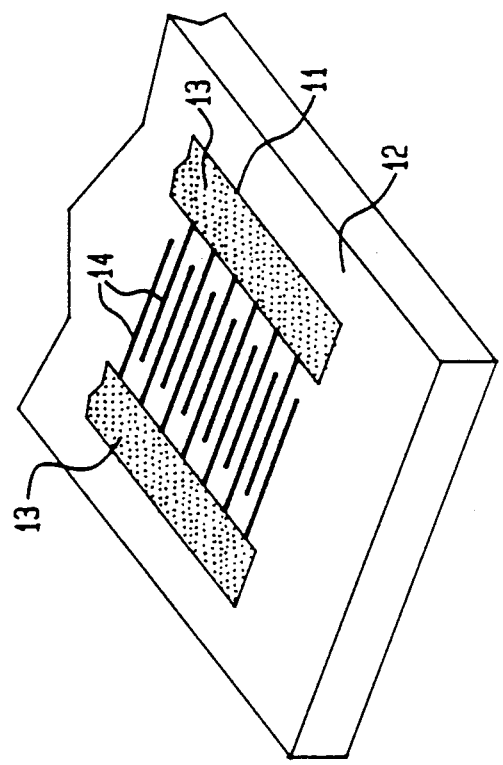
FIG. 1 illustrates a typical prior art SAW transducer.

Turning now to FIG. 1 of the drawings, there is shown a typical prior art surface acoustic wave (SAW) device. A conventional periodic interdigital transducer (IDT) 11 is disposed on a piezoelectric substrate 12. Lithium niobate (128° Y-X LiNbO3) is desirable; however, other known substrate materials (e.g., quartz and LiTaO3) may be utilized. The transducer is typically photo-etched in thin-film metal (i.e., aluminum) to produce a rugged, monolithic device.

The IDT is comprised of a pair of parallel bus bars 13 and a plurality of interdigital electrodes 14. As is known to those skilled in the art, the electrode periodicity of the IDT is equal to $\lambda/2$ for the intended frequency of operation. That is, the center-to-center electrode distance is equal to one half the acoustic wavelength.

The net effect of the transducer electrodes and bus bars is to form an acoustic waveguide. Both the metal strips and electrodes provide a slow-wave structure since the metallization, reduces the velocity of the surface acoustic wave.

Figure 2:
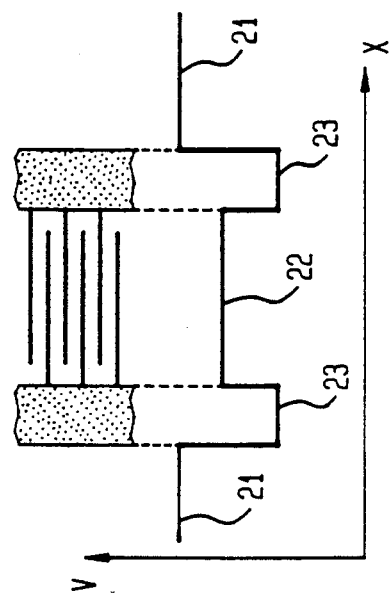
FIG. 2 shows the SAW velocity profile of a conventional SAW interdigital transducer (IDT)

FIG. 2 displays the acoustic velocity profile associated with the SAW IDT; this profile consists of three wave velocity regions: free-surface (crystal surface) 21, semi-metal surface (interdigital electrodes) 22, and metal surface (bus bars) 23. As is evident from the profile, the wave velocity is highest in the free-surface region 21, lowest in the metal surface region 23, and intermediate in the semi-metal region 22.

The SAW IDT structure acts as a multi-mode waveguide wherein the generation of unwanted waveguide modes causes additional device loss. This waveguide effect becomes even more important as the device operating frequency increases, since the thickness of the transducer metallization, as measured in acoustic wavelengths, is increased. Thus, this relatively thicker metallization greatly increases the waveguiding effect.

The transducer waveguide modes include guided, leaky and nonpropagating electrostatic modes, wherein the guided modes normally dominate the performance of a SAW device. Two types of guided modes can exist. The first can be described as the guided trigonometric modes where the modes in the center region of the guide are represented by sine and cosine functions. The second type, which is illustrated in FIG. 3, can be described as guided hyperbolic modes where the modes in the center region are represented by hyperbolic sine and cosine functions.

In the hyperbolic profile 31 of FIG. 3, portions 32 under the curve represent the regions on the SAW IDT corresponding to the bus bars. These modes (32) can only exist if the bus bars have sufficient width to cause guiding. However, the bus bars of almost all SAW devices are normally wider than the theoretical $2\lambda$ (i.e. the width below which hyperbolic modes do not occur) in order to reduce resistive losses. Hence, a major portion of the acoustic energy becomes "trapped" under the bus bars.

Figure 4:
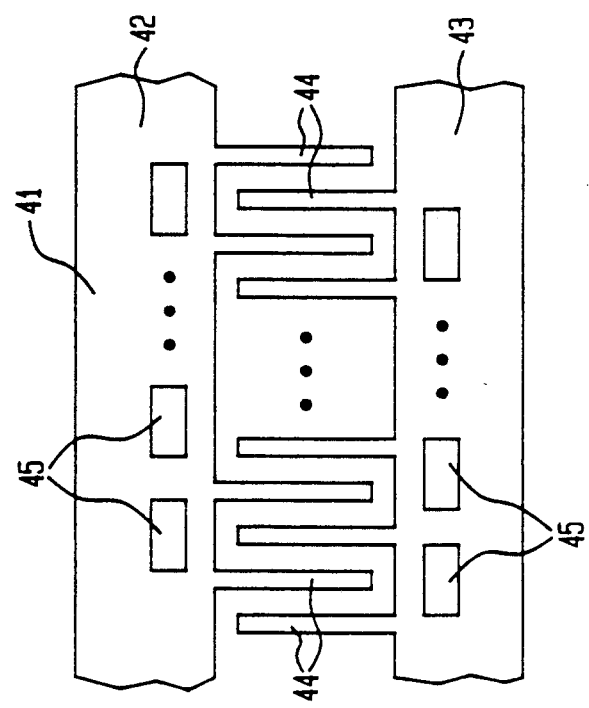
FIG. 4 illustrates a SAW transducer in accordance with the present invention.

In an effort to confine the acoustic energy to the center (i.e. the interdigital electrodes) region of the transducer structure, the present invention was devised. FIG. 4 depicts a transducer 41 of the present invention. The metal bus bars, 42 and 43 respectively, are aligned parallel to and separated from each other at a preselected distance. A plurality of interdigital electrode fingers 44 extend from each bus bar so that a forked configuration is formed by each bus bar- electrode array combination. The electrode finger periodicity is $\lambda/2$ where is the acoustic wavelength. That is, the center-to-center distance from one electrode finger to the next is $\lambda/2$.

A plurality of "windows" or slots 45 are aligned along the length of each of the bus bars. Preferably, the slot spacing (center-to-center) is less than $\lambda/2$ but greater than the spacing between electrode fingers (i.e. typically $\lambda/4$). Nominally, the slot spacing is set at $\lambda/3$.

Figure 5:
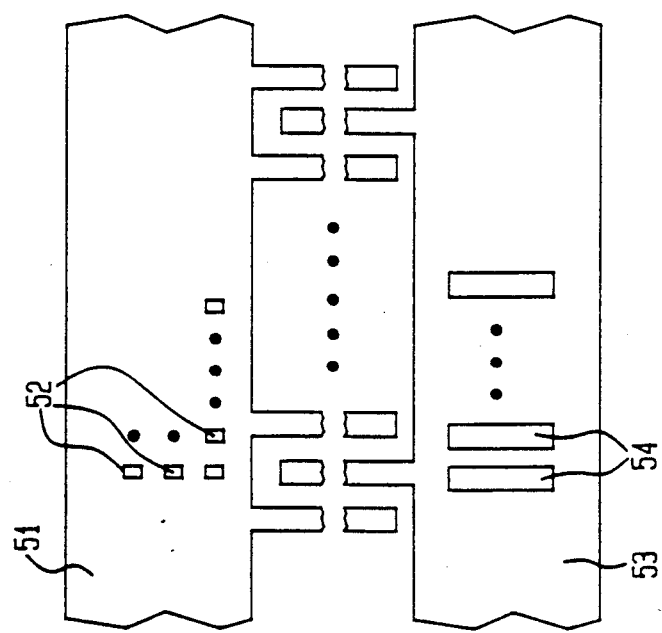
FIG. 5 illustrates variations in a SAW transducer in accordance with the present invention.

FIG. 5 typifies various slot arrangements. The first metal bus bar 51 displays a multiple array of squares slots 52. The second metal bus bar 53 shows a linear array of rectangular slots 54. The arrays of slots extend the length of the bus bars and transversely across the width to avoid any resonant effects, and the outer edges of the bus bars are solid metal film to minimize resistive film losses. Both metal bus bars should have the same regular array or pattern of slots. This is merely an illustration of different arrays which may be used and in no way limits the design of the present invention.

By introducing these windows or slots in the metal bus bars, the percentage of metal in the bus bar region is reduced to an amount below the percentage of metallization in the electrode region, which is typically fifty percent. As a result, the surface wave velocity in the bus bar region is greater than the velocity in the electrode region. FIG. 6 displays such a profile, showing the velocity 61 highest in the crystal surface region and lowest (velocity) 62 in the electrode region wherein the metallization percentage is the highest. The velocity 63 in the bus bar region is intermediate to the velocity in the electrode region and that in the crystal surface region. The velocity profile corresponds to the SAW transducer 64. The area 65 between the slots 66 and the inner edge of the bus bars has a width less than $2\lambda$, so that the hyperbolic modes do not occur. The exact size, shape, orientation, position and periodicity of the "windows" or slots in the bus-bar metallization must be optimized in order to keep resistive losses acceptably low while avoiding a grating structure which could also generate other undesired modes including bulk waves. The "windows" in the bus bars may be off center with respect to the electrode finger periodicity in order to minimize resistive losses. As a result, the inventive structure will form a more well behaved transducer waveguide and minimize the generation of undesired hyperbolic modes. The lowest velocity region (i.e. the acoustic aperture) will contain the most acoustic energy, providing efficient guiding along the SAW transducer structure.

Having shown and described what is at present to be the preferred embodiments of the invention, it should be understood that the same has been shown by way of illustration and not limitation. And, all modifications, alterations and changes coming within the spirit and scope of the invention are meant to be included herein.

What is claimed is:

1. A surface acoustic wave transducer comprising, in combination:
   a piezoelectric substrate;
   a pair of metal bus bars positioned on said substrate parallel to and separated from each other a preselected distance, said metal bus bars having a plurality of slots along each respective length, said plurality of slots patterned in a regular array and spaced at a nominal center-to-center distance of $\lambda/3$; and
   a plurality of interdigital electrode fingers extending from each of said metal bus bars.

2. A SAW device as defined in claim 1 wherein said plurality of slots along each respective length is a multiple array of squares.

3. A SAW transducer as defined in claim 1 wherein said plurality of slots along each respective length is a linear array of rectangles.

4. A SAW transducer having a surface whereon surface acoustic waves are guided at a velocity, comprising in combination;
   a piezoelectric substrate having a free surface region;
   a pair of metal bus bars positioned on said substrate parallel to and separated from each other by a preselected distance, said metal bus bars having a plurality of slots along each respective length, said plurality of slots patterned in a regular array and spaced at a nominal center-to-center distance of $\lambda/3$;
   a plurality of interdigitated electrode fingers extending form each of said metal bus bars, wherein said free surface region guides said surface acoustic waves at the highest velocity with respect to said interdigitated electrode fingers and said metal bus bars, and wherein said plurality of interdigitated electrode fingers guides said surface acoustic waves at the lowest velocity with respect to said free surface region and said metal bus bar, and wherein said pair of metal bus bars guides said surface acoustic waves at a velocity intermediate to said highest and lowest velocities.

* * * * *